(12) United States Patent
Yanagisawa et al.

(10) Patent No.: US 7,771,850 B2
(45) Date of Patent: Aug. 10, 2010

(54) ELECTROMAGNETIC WAVE SHIELDING LAMINATE AND DISPLAY DEVICE EMPLOYING IT

(75) Inventors: Tohru Yanagisawa, Tokyo (JP); Tamotsu Morimoto, Chiba (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 12/202,953

(22) Filed: Sep. 2, 2008

(65) Prior Publication Data

US 2009/0004492 A1 Jan. 1, 2009

Related U.S. Application Data

(63) Continuation of application No. 10/922,938, filed on Aug. 23, 2004, now abandoned.

(30) Foreign Application Priority Data

Aug. 25, 2003 (JP) .............................. 2003-208674

(51) Int. Cl.
*B32B 19/04* (2006.01)
(52) U.S. Cl. ...................................... 428/701; 428/702
(58) Field of Classification Search ................. 428/472, 428/701, 702
See application file for complete search history.

(56) References Cited

U.S. PATENT DOCUMENTS

| 6,316,110 | B1 | 11/2001 | Anzaki et al. | |
| 6,398,925 | B1 * | 6/2002 | Arbab et al. | ............ 204/192.22 |
| 6,490,091 | B1 * | 12/2002 | Woodruff et al. | ............ 359/585 |
| 6,579,423 | B2 | 6/2003 | Anzaki et al. | |
| 6,632,491 | B1 | 10/2003 | Thomsen et al. | |
| 7,005,189 | B1 * | 2/2006 | Tachibana et al. | ............ 428/432 |

| 2003/0170466 | A1 | 9/2003 | Stachowiak |
| 2008/0057264 | A1 | 3/2008 | Morimoto et al. |

FOREIGN PATENT DOCUMENTS

| EP | 1 043 606 A1 | 10/2000 |
| GB | 2 372 043 A | 8/2002 |
| JP | 10-217380 | 8/1998 |
| JP | 2000-59082 | 2/2000 |
| JP | 2000-105312 | 4/2000 |

(Continued)

OTHER PUBLICATIONS

European Patent Office Action issued in Application No. 04 771 975.2 - 1242, May 18, 2010. 5 pages.

(Continued)

*Primary Examiner*—Jennifer C. McNeil
*Assistant Examiner*—Lauren Robinson
(74) *Attorney, Agent, or Firm*—Oblon, Spivak, McClelland, Maier & Neustadt, L.L.P.

(57) ABSTRACT

An electromagnetic wave shielding laminate comprising a transparent substrate and an electromagnetic wave shielding film formed thereon, characterized in that the electromagnetic wave shielding film has, sequentially from the substrate side, a first high refractive index layer made of a material having a refractive index of at least 2.0, a first oxide layer containing zinc oxide as the main component, an electroconductive layer containing silver as the main component, and a second high refractive index layer made of a material having a refractive index of at least 2.0.

32 Claims, 1 Drawing Sheet

FOREIGN PATENT DOCUMENTS

| | | |
|---|---|---|
| JP | 2000-229371 | 8/2000 |
| JP | 2000-246831 | 9/2000 |
| JP | 2000-294980 | 10/2000 |
| JP | 2002-6106 | 1/2002 |
| JP | 2002-535713 | 10/2002 |
| JP | 2003-98340 | 4/2003 |
| JP | 2003-133787 | 5/2003 |
| JP | 2003-157018 | 5/2003 |
| JP | 2003-0093734 | 12/2003 |
| JP | 2004-207383 | 7/2004 |
| WO | WO 98/13850 | 4/1998 |
| WO | WO 00/40402 * | 7/2000 |
| WO | WO 03/037056 | 5/2003 |

OTHER PUBLICATIONS

K. Von. Rottkay et al;, "Optical Indices of Pyrolytic Tin-Oxide Glass", Mater. Res. Soc. Symp/. Proc. 426 (1996) 449, LBNL Publication 38586. http://gaia.lbl.gov/btech/papers/38598.pdf; pp. 1-7.

"Explanation about Evidence (1st)" sent from the Japan Patent Office as a defendant in Suit against appeal trial decision No. Heisei-21 (Gyo-ke) 10362 and its English translation, 3 pages.

* cited by examiner

ELECTROMAGNETIC WAVE SHIELDING LAMINATE AND DISPLAY DEVICE EMPLOYING IT

CROSS-REFERENCE TO RELATED APPLICATIONS

This application is a continuation of co-pending U.S. patent application Ser. No. 10/922,938, filed Aug. 23, 2004, which claims priority to Japanese Application No. 2003-208674, filed Aug. 25, 2003, the entire contents of each of which are hereby incorporated herein by reference.

BACKGROUND OF THE INVENTION

1. Field of the Invention

The present invention relates to an electromagnetic wave shielding laminate having a plurality of layers laminated on a substrate and a display device provided with such an electromagnetic wave shielding laminate.

2. Discussion of Background

Electromagnetic waves are emitted from a luminescent screen of a plasma display panel (PDP). Such electromagnetic waves are influential over electronic equipment located nearby to cause malfunction thereof. Therefore, for the purpose of shielding such electromagnetic waves, it has heretofore been known to install on the front surface of the luminescent screen one having a transparent electroconductive film covered on a substrate of e.g. glass.

For example, a laminate wherein titanium oxide and a metal layer are alternately laminated, or a protecting plate for PDP coated with a multilayer conductive film, wherein an oxide layer containing, as the main component, zinc oxide (ZnO) containing at least one metal, and a metal layer containing silver (Ag) as the main component are alternately laminated in a total of (2n+1) layers (wherein n is a positive integer) from the substrate side, has been proposed (Patent Documents 1 and 2).

Such an electromagnetic wave shielding film is usually required to have a high visible light transmittance and a low resistivity. With an electromagnetic wave shielding film having an oxide layer and a metal layer alternately laminated, it is commonly known to increase the number of metal layers laminated or to make metal layers thick, in order to lower the resistivity.

Patent Document 1: WO98/13850

Patent Document 2: JP-A-2000-246831

In prior art disclosed in the above Patent Document 1, palladium is doped to a silver layer in order to improve the moisture resistance of silver. There has been a problem that the resistivity thereby increases. If the number of laminated metal layers is increased in order to lower the resistivity, there has been another problem that the visible transmittance will thereby decrease.

Whereas, in prior art disclosed in Patent Document 2, titanium oxide being a material having a high refractive index, is used as an oxide layer. If a material having a high refractive index like titanium oxide, is used, there will be a merit such that even when the number of laminated layers is increased, the decrease in transmittance will be small. However, the laminate having titanium oxide and silver alternately laminated, has had a problem that the moisture resistance is poor. By adding palladium to silver, the moisture resistance may be improved, but there has been a problem that the resistivity will increase by the addition of palladium.

SUMMARY OF THE INVENTION

In view of the above-mentioned problems of the prior art, the present invention is intended to provide a low cost electromagnetic wave shielding laminate which has a high visible light transmittance and which also has low resistivity and high moisture resistance, and a display device employing it.

The present invention provides an electromagnetic wave shielding laminate comprising a transparent substrate and an electromagnetic wave shielding film formed thereon, characterized in that the electromagnetic wave shielding film has, sequentially from the substrate side, a first high refractive index layer made of a material having a refractive index of at least 2.0, a first oxide layer containing zinc oxide as the main component, an electroconductive layer containing silver as the main component, and a second high refractive index layer made of a material having a refractive index of at least 2.0.

The present invention also provides an electromagnetic wave shielding laminate comprising a transparent substrate and at least two electromagnetic wave shielding films laminated thereon, characterized in that each electromagnetic wave shielding film has, sequentially from the substrate side, a first high refractive index layer made of a material having a refractive index of at least 2.0, a first oxide layer containing zinc oxide as the main component, an electroconductive layer containing silver as the main component, and a second high refractive index layer made of a material having a refractive index of at least 2.0, and the first high refractive index layer and the second high refractive index layer which are in direct contact each other between the electromagnetic wave shielding films, are made of a single layer formed all together.

Further, the present invention provides a display device characterized by comprising a display screen to display images and the electromagnetic wave shielding laminate of the present invention provided on the viewer's side of the display screen.

The electromagnetic wave shielding laminate and the display device of the present invention are a low cost electromagnetic wave shielding laminate which has a high visible light transmittance and which also has low resistivity and high moisture resistance, and a display device employing it.

DESCRIPTION OF SYMBOLS

Figure 1:
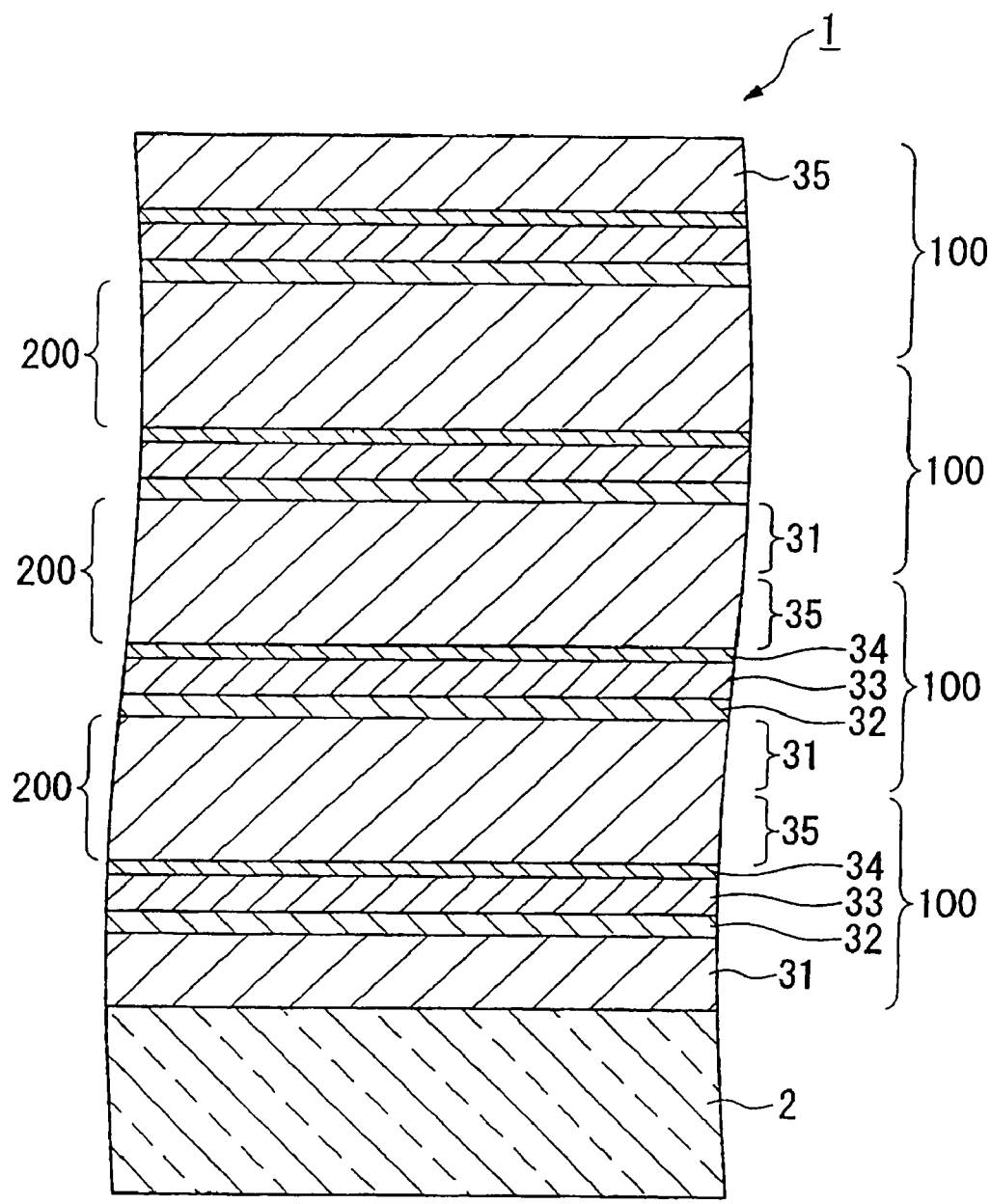
FIG. 1 is a schematic cross-sectional view illustrating one embodiment of the electromagnetic wave shielding laminate of the present invention.

1: Electromagnetic wave shielding laminate
2: Substrate
31: First high refractive index layer
32: First oxide layer
33: Electroconductive layer
34: Second oxide layer
35: Second high refractive index layer
100: Electromagnetic wave shielding film
200: High refractive index layer formed all together

DETAILED DESCRIPTION OF THE PREFERRED EMBODIMENTS

Electromagnetic Wave Shielding Laminate

Now, an example of an electromagnetic wave shielding laminate according to one embodiment of the present invention will be described in detail with reference to the drawing.

First Embodiment

FIG. 1 illustrates an electromagnetic wave shielding laminate 1 according to the first embodiment of the present invention. The dimensional proportions in FIG. 1 are different from the actual ones for the sake of convenience for illustration. This electromagnetic wave shielding laminate 1 comprises a transparent substrate 2 and electromagnetic wave shielding films 100 formed thereon. This embodiment takes a construction wherein four electromagnetic wave shielding films 100 are laminated.

Substrate

The material for the substrate 2 may be any material so long as it is smooth and transparent and capable of transmitting visible light. For example, plastics or glass may be mentioned.

The plastics include, for example, polyethylene terephthalate, polycarbonate, triacetylcellulose, polyether sulfone and polymethyl methacrylate.

The thickness of the substrate 2 may suitably be selected depending upon the particular application. For example, it may be a film or a plate. Further, the substrate 2 may be constituted by a single layer or may be a laminate of a plurality of layers.

The substrate 2 may be used as bonded to a separate glass plate, plastic plate or the like by means of an adhesive or the like. For example, a substrate 2 of a thin plastic film may be bonded to a separate plastic plate, a glass plate or the like, or a substrate 2 made of a glass plate may be bonded to a separate glass plate, a plastic plate or the like.

Electromagnetic Wave Shielding Films

Each of the electromagnetic wave shielding films 100 formed on the substrate 2 basically comprises a first high refractive index layer 31, a first oxide layer 32 formed on the first high refractive index layer 31, an electroconductive layer 33 formed on the first oxide layer 32, and a second high refractive index layer 35 formed on the electroconductive layer 33. In this embodiment, a second oxide layer 34 is further formed between the electroconductive layer 33 and the second high refractive index layer 35, so that the electromagnetic wave shielding film 100 comprises a first high refractive index layer 31, a first oxide layer 32, an electroconductive layer 33, a second oxide layer 34 and a second high refractive index layer 35.

High Refractive Index Layers

Each of the first high refractive index layers 31 and the second high refractive index layers 35 is made of a material having a refractive index of at least 2.0. The refractive index is preferably at least 2.0 and at most 2.7. By adjusting the refractive index of the first high refractive index layers 31 or the second high refractive index layers 35 to a level of at least 2.0, it is possible to maintain the visible light transmittance at a high level even if the laminated number of electromagnetic wave shielding films 100 is increased.

In this specification, the refractive index (n) is meant for the refractive index at a wavelength of 550 nm.

The material for the first high refractive index layers 31 or the second high refractive index layers 35 may, for example, be niobium oxide (n: 2.35), titanium oxide (n: 2.45) or tantalum oxide (n: 2.1 to 2.2). Among them, niobium oxide or titanium oxide is preferred, and niobium oxide is particularly preferred. By making the first high refractive index layers 31 or the second high refractive index layers 35 to be layers containing niobium oxide as the main component, it is possible to reduce the penetration amount of water and to improve the moisture resistance of the electromagnetic wave shielding films 100. It is particularly preferred that the first high refractive index layers 31, or the second high refractive index layers 35 are layers containing niobium oxide as the main component, since the above effect is thereby large.

Further, the first high refractive index layers 31 or the second high refractive index layers 35 may be crystalline or amorphous. However, they are preferably amorphous. By making the first high refractive index layers 31 or the second high refractive index layers 35 to be amorphous, it is possible to reduce penetration of water via crystal grains and thereby to further improve the moisture resistance of the electromagnetic wave shielding films 100.

The geometrical film thickness of each of the first high refractive index layers 31 is preferably from 20 to 50 nm, more preferably from 30 to 40 nm. Further, the geometrical film thickness of each of the second high refractive index layers 35 is preferably from 20 to 50 nm, more preferably from 30 to 40 nm.

This embodiment takes a construction such that four electromagnetic wave shielding films 100 are laminated on a transparent substrate 2, whereby the first high refractive index layer 31 in the electromagnetic wave shielding film 100 of the second laminated layer is laminated directly on the second high refractive index layer 35 in the electromagnetic wave shielding film 100 of the first laminated layer. In this case, the second high refractive index layer 35 and the first high refractive index layer 31 have the same composition. In FIG. 1, the second high refractive index layer 35 and the first high refractive index layer 31 are shown to be a high refractive index layer 200, as they are put together and formed all together. Further, if necessary, the first high refractive index layer 31 and the second high refractive index layer 35 may be formed in two or more operations.

With a view to reducing the visible light reflectance and broadening the wavelength zone wherein a low reflectance is obtainable, the thickness of each of the first high refractive index layer 31 of the first laminated layer and the second high refractive index layer 35 of the finally laminated layer, is preferably thinner (by about ½) than the thickness of the high refractive index layers 200. Further, the thicknesses of the respective layers may suitably be adjusted in order to adjust the overall optical characteristics inclusive of the substrate.

The method for forming the first high refractive index layers 31 or the second high refractive index layers 35, may, for example, be a method of forming them by a sputtering method employing a reduced type target of a metal oxide, an ion plating method, a vapor deposition method or a CVD method. Among them, a method of forming them by a sputtering method employing a reduced type target of niobium oxide is advantageous in that at the time of forming a niobium oxide layer on an electroconductive layer 33, it is possible to prevent oxidation of the electroconductive layer 33 and to form the layer uniformly over a large area at a high speed.

The reduced type target of niobium oxide to be used here, is a target deficient in oxygen as compared with the stoichiometrical composition of niobium oxide. Specifically, it is more preferably one having a composition represented by the formula $Nb_2O_x$ (0<X<5) and having electroconductivity, which can be discharged by a DC sputtering method to form a film. Further, it is also possible to employ a method of sputtering in an oxygen atmosphere by using metallic niobium as a target.

When a reduced type target is employed, it is preferred to use an inert gas containing from 5 to 20 vol % of an oxidizing gas, as the sputtering gas. As such an oxidizing gas, oxygen gas may usually be used. However, it is also possible to use, for example, nitrogen monoxide, nitrogen dioxide, carbon monoxide, carbon dioxide or ozone.

Oxide Layers

First Oxide Layers

The first oxide layers 32 are made of a material containing zinc oxide as the main component. The material containing zinc oxide as the main component has its crystal structure which is close to the crystal structure of silver constituting the electroconductive layers 33. Accordingly, if silver is laminated on the oxide layer made of the material containing zinc oxide as the main component, silver having good crystallinity may be obtained. With the silver having good crystallinity, it is considered possible to reduce migration. Thus, by making the first oxide layers 32 from the material containing zinc oxide as the main component, it is possible to suppress migration of silver and to maintain the adhesion between the first oxide layer 32 and the electroconductive layer 33. By maintaining the adhesion, it is possible to prevent penetration of moisture into the grain boundaries, whereby the moisture resistance of silver will be good. When the electromagnetic wave shielding film 100 in the present invention contains the second oxide layer (made of the material containing zinc oxide as the main component), the adhesion can similarly be maintained at the interface between the electroconductive layer 33 made of silver having good crystallinity, and the second oxide layer 34 (made of a material containing zinc oxide as the main component), whereby the moisture resistance will further be improved.

Here, migration of silver means that silver will be diffused and agglomerated. If silver is agglomerated, the moisture resistance will be poor, and at the same time, the agglomerated portion will be whitened to show a poor outer appearance.

The material containing zinc oxide as the main component means that zinc oxide is contained in an amount of at least 80 atomic %, preferably at least 90 atomic %. Specifically, it may be one composed substantially solely of zinc oxide (ZnO), or it may, for example, be an oxide (hereinafter referred to as AZO) which comprises zinc oxide as the main component and aluminum oxide ($Al_2O_3$) or an oxide (hereinafter referred to as GZO) which comprises zinc oxide as the main component and gallium oxide ($Ga_2O_3$). Among them, AZO or GZO is preferred from the viewpoint of the durability of the oxide layer, and AZO is most preferred, since it is close to the crystal structure of silver.

Aluminum contained in AZO formed into a film, is preferably from 1 to 10 atomic %, more preferably from 2 to 6 atomic %, based on the total amount of aluminum oxide and zinc oxide. Generally, a film formed of a simple substance of zinc oxide has a large internal stress. If the internal stress is large, cracks are likely to be formed in the first oxide layers 32, and moisture is likely to penetrate through such cracked portions.

By controlling the content of aluminum oxide to be at least 1 atomic %, it is possible to reduce the internal stress of the first oxide layers 32 and thereby to minimize the possibility of cracking. By controlling the content of aluminum oxide to be at most 10 atomic %, it is possible to maintain the crystal structure of zinc oxide.

The geometrical thickness of each of the first oxide layers 32 is preferably from 2 nm to 10 nm, more preferably from 3 nm to 6 nm. By controlling the geometrical thickness of each of the first oxide layers 32 to be at most 10 nm, the effects of the adjacent first high refractive index layers 31 will not be impaired, such being desirable.

In the electroconductive layers 33, in order to obtain silver having good crystallinity, the influence of the undercoating will be substantial, and accordingly it is preferred that the geometrical thickness of each of the first oxide layers 32 is large. In a case where the electromagnetic wave shielding laminate of the present invention has a second oxide layer, the geometrical thickness of the first oxide layer 32 is preferably larger than the geometrical thickness of the second oxide layer 34.

The method for forming the first oxide layers 32 may, for example, be a physical vapor deposition method such as a vacuum vapor deposition method, a reactive vapor deposition method, an ion beam assisted vapor deposition method, a sputtering method or an ion plating method, or a chemical vapor deposition method such as a plasma enhanced CVD method. Among them, a DC sputtering method is preferred, since control of the film thickness is thereby relatively easy, a practical film strength can be obtained even when it is formed on a low temperature substrate, a film formation over a large area is easy, or formation of a laminated film is easy if a so-called inline installation is employed.

Second Oxide Layers

The second oxide layers 34 are made of a material containing a metal oxide as the main component. The metal oxide may preferably be, for example, a material containing zinc oxide as the main component, a material containing titanium oxide as the main component, or a material containing indium oxide as the main component. In a case where the material containing zinc oxide as the main component, is used for the second oxide layers 34, like in the case of the interface between the first oxide layer and the electroconductive layer 33 made of silver, it is possible to maintain the adhesion at the interface between the electroconductive layer 33 made of silver having good crystallinity and the second oxide layer 34 made of a material containing zinc oxide as the main component, whereby the moisture resistance will be further improved, such being preferred.

As the second oxide layers 34, titanium oxide, AZO, GZO or an oxide comprising indium oxide as the main component and tin oxide ($SnO_2$), may more preferably be mentioned. Among them, AZO or GZO is preferred from the durability of the oxide layer, and AZO is most preferred, since it is closer to the crystal structure of silver.

Aluminum contained in AZO formed into a film is preferably from 1 to 10 atomic %, more preferably from 2 to 6 atomic %, based on the total amount of aluminum oxide and zinc oxide. Generally, the film formed from a simple substance of zinc oxide has a large internal stress. If the internal stress is large, cracks are likely to form in the second oxide layers 34, and moisture is likely to penetrate through such cracked portions.

By controlling the content of aluminum oxide to be at least 1 atomic %, it is possible to reduce the internal stress of the second oxide layers 34 and thereby to minimize the possibility of cracking. By controlling the content of aluminum oxide to be at most 10 atomic %, it is possible to maintain the crystal structure of zinc oxide.

The geometrical thickness of each of the second oxide layers 34 is preferably from 1 nm to 6 nm, more preferably from 2 nm to 4 nm.

The method for forming the second oxide layers may, for example, be a physical vapor deposition method such as a vacuum vapor deposition method, a reactive vapor deposition method, an ion beam assisted vapor deposition method, a sputtering method or an ion plating method, or a chemical vapor deposition method such as a plasma enhanced CVD method. Among them, a DC sputtering method is preferred, since control of the film thickness is relatively easy, a practical film strength can be obtained even when the film is formed on a low temperature substrate, film formation over a large area is easy, and formation of laminated films is easy if a so-called inline installation is employed.

Electroconductive Layers

The electroconductive layers 33 are made of a material containing silver as the main component. Here, the material containing silver as the main component means that the content of silver is at least 99.8 atomic % based on the total metal contained in the material. As the material containing silver as the main component, a simple substance of silver, or an alloy having at least one metal selected from palladium platinum, gold, iridium, rhodium, copper and bismuth incorporated to silver, may be mentioned. By controlling the content of silver to be at least 99.8 atomic %, it is possible to lower the resistivity of the electromagnetic wave shielding laminate 1 even if the thickness of the conductive layers 33 is made thin. Further, the resistivity can be made low even if the number of electromagnetic wave shielding films 100 laminated, is small, whereby it is possible to obtain an electromagnetic wave shielding laminate 1 which has a low resistivity and a high visible light transmittance.

The content of silver in the electroconductive layers 33 is preferably at least 99.8 atomic %, and further, a simple substance of silver of at least 99.9 atomic % is most preferred also from the viewpoint of the cost.

The geometrical thickness of each of the electroconductive layers 33 is preferably from 5 to 20 nm. The geometrical thicknesses of the respective electroconductive layers 33 may be the same or different.

Formation of the electroconductive layers 33 may be carried out by various methods such as a sputtering method and a vapor deposition method. It is particularly preferred to form them by a DC sputtering method, whereby the film forming speed is high, and a layer having a uniform thickness and a uniform quality can be formed over a large area.

The laminated number of electromagnetic wave shielding films 100 laminated on the substrate 2 is preferably at least 2 in order to provide a sufficient electromagnetic wave-shielding ability. When the laminated number is at least 2, an adequate electromagnetic wave shielding performance can be obtained. Further, it is more preferred that at least 3 such films are laminated. Further, it is preferred that the laminated number of electromagnetic wave shielding films 100 is at most 8, whereby a high visible light transmittance can be maintained. From such a viewpoint, the laminated number is most preferably from 3 to 6.

Display Device

Now, the display device according to another embodiment of the present invention will be described in detail.

Second Embodiment

The display device according to the second embodiment of the present invention comprises a display screen to display images and an electromagnetic wave shielding laminate provided on the viewer's side of the display screen.

Such a display device may, for example, be a plasma display panel (PDP), a liquid crystal display device (LCD), an electroluminescence display (ELD) or a cathode ray tube display device (CRT).

The viewer's side of the display screen to display images is usually constituted by a transparent substrate such as a glass substrate or a plastic substrate. The electromagnetic wave shielding laminate is not particularly limited so long as it is the electromagnetic wave shielding laminate of the present invention. For example, it is possible to employ the electromagnetic wave shielding laminate 1 according to the first embodiment.

The electromagnetic wave shielding laminate may be bonded directly to the viewer's side surface of the display screen by means of e.g. an adhesive, or may be installed with a space from the display screen.

Otherwise, on the viewer's side of the display screen, a front plate made of glass, plastic or the like may be installed afresh, and on the viewer's side or display's side of the front plate, the electromagnetic wave shielding laminate may be directly bonded. Or, on the viewer's side or display's side of the front plate, the electromagnetic wave shielding laminate may be installed with a space from the front plate.

Third Embodiment

The display device according to the third embodiment of the present invention comprises a display screen to display images and an electromagnetic wave shielding film formed on the surface of the viewer-side of the display screen.

Such a display device may, for example, be:

(1) A display device wherein the electromagnetic wave shielding film has, sequentially from the viewer's side surface of the display screen, a first high refractive index layer made of a material having a refractive index of at least 2.0, a first oxide layer containing zinc oxide as the main component, an electroconductive layer containing silver as the main component, and a second high refractive index layer made of a material having a refractive index of at least 2.0;

(2) A display device wherein such an electromagnetic wave shielding film has a second oxide layer between the electroconductive layer and the second high refractive index layer;

(3) A display device wherein the first or second high refractive index layer of such an electromagnetic wave shielding film is a layer containing niobium oxide as the main component;

(4) A display device wherein the content of silver in the electroconductive layer in such an electromagnetic wave shielding film is at least 99.8 atomic %; or (5) A display device wherein at least three such electromagnetic wave shielding films are laminated from the substrate side.

In this case, the viewer's side of the display screen is usually constituted by a transparent substrate such as a glass substrate or a plastic substrate.

Further, as such an electromagnetic wave shielding film, the electromagnetic wave shielding film 100 according to the first embodiment may, for example, be used. In such a case, on the viewer's side surface of the display screen, a first high refractive index layer 31, a first oxide layer 32, an electroconductive layer 33, a second oxide layer 34 and a second high refractive index layer 35 are laminated sequentially.

The electromagnetic wave shielding film may be formed directly on the viewer's side surface of the display screen by e.g. a vapor deposition method or a sputtering method.

Now, the present invention will be described in further detail with reference to Examples.

Example 1

As a transparent substrate, a polyethylene terephthalate film (hereinafter referred to as PET, thickness: 100 μm) was used which is a high transmittance film for optical use.

For film forming by sputtering, a Web coater film forming apparatus (manufactured by Hirano Koon K. K.) was used.

The size of the target was 50 mm×195 mm, and transportation of a substrate was carried out by a roll-to-roll system wherein a long rolled-up film substrate was dispensed and via a guide roll, sputtered at a can roll position and rolled up again via a guide roll. With respect to the sputtering power source, film forming was carried out by DC discharge (MDX-10K, manufactured by AE Company, RPG-100, manufactured by ENI Company).

On the film substrate, four electromagnetic wave shielding films were formed in the order of high refractive index layer (1)/oxide layer (1)/electroconductive layer/oxide layer (2)/high refractive index layer (2)/oxide layer (1)/electroconductive layer/oxide layer (2)/high refractive index layer (2)/oxide layer (1)/electroconductive layer/oxide layer (2)/high refractive index layer (2)/oxide layer (1)/electroconductive layer/oxide layer (2)/high refractive index layer (1), from the substrate side.

Detailed film forming conditions are shown in Table 1.

TABLE 1

| Electromagnetic wave shielding film | Target material | Sputtering gas (Ar/O$_2$ cm$^3$min$^{-1}$) | Sputtering power | Sputtering pressure | Film thickness |
|---|---|---|---|---|---|
| High refractive index layer (1) | NS-NBO | 93/7 | 0.50 kW | 0.399 Pa | 32 nm |
| Oxide layer (1) | AZO | 100/0 | 0.10 kW | 0.798 Pa | 5 nm |
| Electroconductive layer | Ag | 100/0 | 0.15 kW | 0.798 Pa | 16 nm |
| Oxide layer (2) | AZO | 100/0 | 0.10 kW | 0.798 Pa | 2 nm |
| High refractive index layer (2) | NS-NBO | 93/7 | 0.50 kW | 0.399 Pa | 64 nm |

The high refractive index layer (1) and the high refractive index layer (2) were formed by DC discharge by using niobium oxide (NS-NBO, manufactured by ASAHI GLASS CERAMICS CO., LTD.) as a target. The oxide layer (1) and the oxide layer (2) were formed by DC discharge by using one having 3 mass % of aluminum oxide added to zinc oxide (manufactured by ASAHI GLASS CERAMICS CO., LTD.) as a target. Further, the electroconductive layer was formed by DC discharge by using silver having a purity of 99.9 atomic %, as a target.

Further, the contents of zinc and aluminum in the oxide layers in the obtained electromagnetic wave shielding laminate were substantially the same as the contents of zinc and aluminum contained in the target. Adjustment of the film forming speed was carried out by the transportation speed of the substrate, and in the case of a material whereby the film forming speed was slow, reciprocating film forming was repeated a few times to obtain the desired thickness. The film thickness was measured by means of a feeler type film thickness meter (Dektak3$^{st}$ distributor of ULVAC Company). The results of the film thicknesses thus obtained are shown in Table 1.

EVALUATION (1) Visible light transmittance

The visible light transmittance of the obtained electromagnetic wave shielding laminate was measured by using Model 304 transmittance meter manufactured by Asahi Spectra Co., Ltd. The results of the measurement of the visible light transmittance are shown in the following Table 2.

(2) Resistivity

The resistivity of the obtained electromagnetic wave shielding laminate was measured by using 717 conductance monitor manufactured by DELCOM Company. The results of the measurement of the resistivity are shown in the following Table 2.

(3) Moisture resistance

A NaCl test was used for evaluation of the moisture resistance. Firstly, 1 µl of a 2 mass % NaCl aqueous solution was dropped on an electromagnetic wave shielding film of an electromagnetic wave shielding laminate and then dried. Thereafter, a PET film (thickness: 100 µm) provided with an adhesive material (ADC2 manufactured by Poratechno Company or PTR 2500 manufactured by Arisawa Seisakusho K. K., thickness: 25 µm) was bonded on the electromagnetic wave shielding film, followed by storage for 100 hours in a constant temperature and humidity tank at a temperature of 60° C. with a relative humidity of 95%, whereupon the assembly was taken out, and the PET film was peeled. The area of the portion which was deteriorated and peeled was measured by a slide gauge. The results of the measurement of the deteriorated area are shown in the following Table 2.

Comparative Example 1

Without forming an oxide layer (1) on a high refractive index layer (1), an electroconductive layer was formed directly on the high refractive index layer (1) under the same film forming conditions as in Example 1. Otherwise, the operation was carried out in the same manner as in Example 1 to obtain an electromagnetic wave shielding laminate.

With respect to the obtained electromagnetic wave shielding laminate, the visible light transmittance, the resistivity and the moisture resistance were evaluated by the same methods as in Example 1. The results of the measurement of the visible light transmittance, the resistivity and the moisture resistance will be shown in the following Table 2.

Comparative Example 2

Without forming an oxide layer (1) and an oxide layer (2), an electroconductive layer was formed directly between the high refractive index layer (1) and the high refractive index layer (2) under the same film forming conditions as in Example 1. Otherwise, the operation was carried out in the same manner as in Example 1 to obtain an electromagnetic wave shielding laminate.

With respect to the obtained electromagnetic wave shielding laminate, evaluation of the visible light transmittance, the resistivity and the moisture resistance was carried out by the same methods as in Example 1. The results of measurements of the visible light transmittance, resistivity and the moisture resistance will be shown in the following Table 2.

TABLE 2

|  | Transmittance (%) | Resistivity (Ω) | Deteriorated area (mm$^2$) |
|---|---|---|---|
| Ex. 1 | 57.3 | 0.69 | 17 |
| Comp. Ex. 1 | 54.8 | 0.76 | 109 |
| Comp. Ex. 2 | 51.8 | 0.78 | 657 |

When the results of Example 1 and Comparative Example 1 are compared, it is evident that in the visible light transmittance and the resistivity, Example 1 is substantially equal to Comparative Example 1 and thus confirmed to be a good electromagnetic wave shielding laminate. Further, with respect to the deteriorated area by the NaCl test, the deteriorated area in Example 1 is ⅙ of the deteriorated area in Comparative Example 1, and thus, it was confirmed that Example 1 was excellent in moisture resistance. Further, from these results, it was confirmed that the moisture resistance of the electromagnetic wave shielding film was improved by forming an oxide layer (1) between the high refractive index layer (1) and the electroconductive layer.

Then, when the results of the Example 1 and Comparative Example 2 are compared, it is evident that in the visible light transmittance and the resistivity, Example 1 is substantially equal to Comparative Example 2, but with respect to the deteriorated area by the NaCl test, the deteriorated area in Example 1 is ⅛ of the deteriorated area in Comparative Example 2. Thus, it was confirmed that Example 1 was excellent in moisture resistance. From these results, it was confirmed that the presence of the oxide layer (1) and the oxide layer (2) contributed substantially to the improvement of the moisture resistance of the electromagnetic wave shielding film.

From the foregoing results, it was confirmed that the electromagnetic wave shielding laminate obtained in Example 1 is an electromagnetic wave shielding laminate which has a high visible light transmittance and a low resistance and which is excellent also in the moisture resistance.

Example 2

An electromagnetic wave shielding laminate was prepared in the same manner as in Example 1 except that the film forming conditions were as shown in Table 3.

With respect to the obtained electromagnetic wave shielding laminate, evaluation of the moisture resistance was carried out in the same manner as in Example 1. The result of the measurement of the moisture resistance is shown in Table 6.

TABLE 3

| Electro-magnetic wave shielding film | Target material | Sputtering gas (Ar/O$_2$ cm$^3$min$^{-1}$) | Sputtering power | Sputtering pressure | Film thickness |
|---|---|---|---|---|---|
| High refractive index layer (1) | NS-NBO | 85/15 | 0.50 kW | 0.399 Pa | 30 nm |
| Oxide layer (1) | AZO | 100/0 | 0.10 kW | 0.798 | 5 nm |
| Electro-conductive layer | Ag | 100/0 | 0.15 kW | 0.798 | 16 nm |
| Oxide layer (2) | AZO | 100/0 | 0.10 kW | 0.798 | 2 nm |
| High refractive index layer (2) | NS-NBO | 85/15 | 0.50 kW | 0.399 | 60 nm |

Example 3

An electromagnetic wave shielding laminate was prepared in the same manner as in Example 1 except that the film forming conditions were as shown in Table 4.

The high refractive index layers (1) and (2) were formed by DC discharge by using reduced type titanium oxide (TXO) target (manufactured by ASAHI GLASS CERAMICS CO., LTD.).

With respect to the obtained electromagnetic wave shielding laminate, evaluation of the moisture resistance was carried out in the same manner as in Example 1. The result of the measurement of the moisture resistance is shown in Table 6.

TABLE 4

| Electro-magnetic wave shielding film | Target material | Sputtering gas (Ar/O$_2$ cm$^3$min$^{-1}$) | Sputtering power | Sputtering pressure | Film thickness |
|---|---|---|---|---|---|
| High refractive index layer (1) | TXO | 93/7 | 10.0 kW | 0.399 Pa | 30 nm |
| Oxide layer (1) | AZO | 100/0 | 0.10 kW | 0.798 Pa | 5 nm |
| Electro-conductive layer | Ag | 100/0 | 0.15 kW | 0.798 Pa | 16 nm |
| Oxide layer (2) | AZO | 100/0 | 0.10 kW | 0.798 Pa | 2 nm |
| High refractive index layer (2) | TXO | 93/7 | 10.0 kW | 0.399 Pa | 60 nm |

Comparative Example 3

An electromagnetic wave shielding laminate was prepared in the same manner as in Example 1 except that the film forming conditions were as shown in Table 5, and AZO layers (refractive index: 1.93) (1) and (2) were used instead of the high refractive index layers (1) and (2).

AZO layers (1) and (2) were formed by DC discharge by using one having 3 mass % of aluminum oxide added to zinc oxide (manufactured by ASAHI GLASS CERAMICS CO., LTD.) as a target.

Further, the contents of zinc and aluminum in the oxide layers of the obtained electromagnetic wave shielding laminate were substantially the same as the contents of zinc and aluminum contained in the target.

With respect to the obtained electromagnetic wave shielding laminate, evaluation of the moisture resistance was carried out in the same manner as in Example 1. The result of the measurement of the moisture resistance is shown in Table 6.

TABLE 5

| Electro-magnetic wave shielding film | Target material | Sputtering gas (Ar/O$_2$ cm$^3$min$^{-1}$) | Sputtering power | Sputtering pressure | Film thickness |
|---|---|---|---|---|---|
| AZO layer (1) | AZO | 97/3 | 0.50 kW | 0.399 Pa | 30 nm |
| Oxide layer (1) | AZO | 100/0 | 0.10 kW | 0.798 Pa | 5 nm |
| Electro-conductive layer | Ag | 100/0 | 0.15 kW | 0.798 Pa | 16 nm |
| Oxide layer (2) | AZO | 100/0 | 0.10 kW | 0.798 Pa | 2 nm |
| AZO layer (2) | AZO | 97/3 | 0.50 kW | 0.399 Pa | 60 nm |

TABLE 6

| | Deteriorated area (mm²) |
|---|---|
| Example 2 | 8.2 |
| Example 3 | 21.7 |
| Comparative Example 3 | 71.9 |

In Example 2 employing niobium oxide as the material for the high refractive index layer and in Example 3 employing titanium oxide as the material for the high refractive index layer, only a peripheral portion where NaCl was dropped, was deteriorated, and the deteriorated area was small. When niobium oxide and titanium oxide are compared, the deteriorated area was smaller with niobium oxide, and thus the durability was superior. In Comparative Example 3 wherein AZO layer was used instead of the high refractive index layer, not only the peripheral portion where NaCl was dropped, was deteriorated, but cracks were formed over a wide area of the formed film surface extending from the dropped portion, and the deteriorated area was large.

INDUSTRIAL APPLICABILITY

The electromagnetic wave shielding laminate of the present invention is useful as a filter for e.g. a display device.

The entire disclosure of Japanese Patent Application No. 2003-208674 filed on Aug. 25, 2003 including specification, claims, drawings and summary is incorporated herein by reference in its entirety.

What is claimed is:

1. An electromagnetic wave shielding laminate comprising:
    a transparent substrate; and
    an electromagnetic wave shielding film formed thereon, wherein the electromagnetic wave shielding film includes, sequentially from the substrate side,
        a first high refractive index layer made of a material having a refractive index of at least 2.0,
        a first oxide layer containing zinc oxide,
        an electroconductive layer containing silver as the main component, and
        a second high refractive index layer made of a material having a refractive index of at least 2.0, and each of the first high refractive index layer and the second high refractive index layer is a layer containing niobium oxide as the main component.

2. The electromagnetic wave shielding laminate according to claim 1, wherein the electromagnetic wave shielding film has a second oxide layer between the electroconductive layer and the second high refractive index layer.

3. The electromagnetic wave shielding laminate according to claim 1, wherein the content of silver in the electroconductive layer is at least 99.8 atomic %.

4. The electromagnetic wave shielding laminate according to claim 2, wherein the second oxide layer is an oxide layer containing zinc oxide as the main component.

5. The electromagnetic wave shielding laminate according to claim 1, wherein at least three of said electromagnetic wave shielding films are laminated from the substrate side.

6. The electromagnetic wave shielding laminate according to claim 1, wherein the first oxide layer contains at least 1 atomic % of aluminum oxide.

7. The electromagnetic wave shielding laminate of claim 1, wherein the electroconductive layer does not include palladium.

8. The electromagnetic wave shielding laminate of claim 1, wherein the first oxide layer does not include titanium oxide.

9. The electromagnetic wave shielding laminate of claim 1, wherein the electroconductive layer is in direct contact with the first oxide layer.

10. The electromagnetic wave shielding laminate of claim 1, wherein the first and second high refractive index layers each have a geometrical thickness of from 20 nm to 50 nm.

11. A display device comprising:
    a display screen configured to display images; and
    an electromagnetic wave shielding laminate as defined in claim 1, provided on a viewer's side of the display screen.

12. An electromagnetic wave shielding laminate comprising:
    a transparent substrate; and
    at least two electromagnetic wave shielding films laminated thereon, wherein each electromagnetic wave shielding film includes, sequentially from the substrate side,
        a first high refractive index layer made of a material having a refractive index of at least 2.0,
        a first oxide layer containing zinc oxide as the main component,
        an electroconductive layer containing silver as the main component, and
        a second high refractive index layer made of a material having a refractive index of at least 2.0, and each of the first high refractive index layer and the second high refractive index layer is a layer containing niobium oxide as the main component,
    wherein a first high refractive index layer and a second high refractive index layer are in direct contact with each other between the electromagnetic wave shielding films, forming a combined single layer.

13. The electromagnetic wave shielding laminate according to claim 12, wherein each of the electromagnetic wave shielding films has a second oxide layer between the electroconductive layer and the second high refractive index layer.

14. The electromagnetic wave shielding laminate according to claim 12, wherein the content of silver in the electroconductive layer is at least 99.8 atomic %.

15. The electromagnetic wave shielding laminate according to claim 13, wherein the second oxide layer includes zinc oxide as the main component.

16. The electromagnetic wave shielding laminate according to claim 12, wherein at least three of said electromagnetic wave shielding films are laminated from the substrate side.

17. The electromagnetic wave shielding laminate according to claim 12, wherein the first oxide layer contains at least 1 atomic % of aluminum oxide.

18. The electromagnetic wave shielding laminate of claim 12, wherein the electroconductive layer does not include palladium.

19. The electromagnetic wave shielding laminate of claim 12, wherein the first oxide layer does not include titanium oxide.

20. The electromagnetic wave shielding laminate of claim 12, wherein the electroconductive layer is in direct contact with the first oxide layer.

21. The electromagnetic wave shielding laminate of claim 12 wherein the first and second high refractive index layers each have a geometrical thickness of from 20 nm to 50 nm.

22. A display device comprising:
a display screen to display images; and
an electromagnetic wave shielding laminate as defined in claim 12, provided on a viewer side of the display screen.

23. An electromagnetic wave shielding laminate comprising:
a transparent substrate; and
an electromagnetic wave shielding film formed thereon, wherein the electromagnetic wave shielding film includes, sequentially from the substrate side,
a first high refractive index layer made of a material having a refractive index of at least 2.0,
a first oxide layer containing mainly zinc oxide as the main component,
an electroconductive layer containing silver as the main component, and
a second high refractive index layer made of a material having a refractive index of at least 2.0, and each of the first high refractive index layer and the second high refractive index layer is a layer containing niobium oxide as the main component.

24. The electromagnetic wave shielding laminate according to claim 23, wherein the electromagnetic wave shielding film has a second oxide layer between the electroconductive layer and the second high refractive index layer.

25. The electromagnetic wave shielding laminate according to claim 23, wherein the content of silver in the electroconductive layer is at least 99.8 atomic %.

26. The electromagnetic wave shielding laminate according to claim 24, wherein the second oxide layer includes zinc oxide as the main component.

27. The electromagnetic wave shielding laminate according to claim 23, wherein at least three of said electromagnetic wave shielding films are laminated from the substrate side.

28. The electromagnetic wave shielding laminate of claim 23, wherein the electroconductive layer does not include palladium.

29. The electromagnetic wave shielding laminate of claim 23, wherein the first oxide layer does not include titanium oxide.

30. The electromagnetic wave shielding laminate of claim 23, wherein the electroconductive layer is in direct contact with the first oxide layer.

31. The electromagnetic wave shielding laminate of claim 23, wherein the first and second high refractive index layers each have a geometrical thickness of from 20 nm to 50 nm.

32. A display device comprising:
a display screen to display images; and
an electromagnetic wave shielding laminate as defined in claim 23, provided on a viewer side of the display screen.

* * * * *